(12) United States Patent
Jürgensen et al.

(10) Patent No.: US 6,962,624 B2
(45) Date of Patent: Nov. 8, 2005

(54) METHOD AND DEVICE FOR DEPOSITING IN PARTICULAR ORGANIC LAYERS USING ORGANIC VAPOR PHASE DEPOSITION

(75) Inventors: Holger Jürgensen, Aachen (DE); Gerhard Karl Strauch, Aachen (DE); Markus Schwambera, Aachen (DE)

(73) Assignee: Aixtron AG, (DE)

( * ) Notice: Subject to any disclaimer, the term of this patent is extended or adjusted under 35 U.S.C. 154(b) by 173 days.

(21) Appl. No.: 10/402,220

(22) Filed: Mar. 28, 2003

(65) Prior Publication Data

US 2003/0192471 A1 Oct. 16, 2003

Related U.S. Application Data

(63) Continuation of application No. PCT/EP01/10961, filed on Sep. 22, 2001.

(30) Foreign Application Priority Data

Sep. 29, 2000 (DE) ................................ 100 48 759

(51) Int. Cl.[7] ............................................. C30B 23/06

(52) U.S. Cl. ................ 117/99; 117/102; 117/106; 117/108; 117/109; 117/201; 117/202; 118/715 R

(58) Field of Search ................ 117/106, 108, 109, 117/102, 99, 201, 202; 118/715 R

(56) References Cited

U.S. PATENT DOCUMENTS

| | | | | |
|---|---|---|---|---|
| 2,704,727 A | * | 3/1955 | Pawlyk | 427/252 |
| 4,947,790 A | * | 8/1990 | Gartner et al. | 118/715 |
| 5,186,120 A | * | 2/1993 | Ohnishi et al. | 118/667 |
| 5,227,340 A | * | 7/1993 | Pintchovski et al. | 438/5 |
| 5,554,220 A | * | 9/1996 | Forrest et al. | 117/88 |
| 5,904,771 A | | 5/1999 | Tasaki et al. | 117/105 |
| 6,558,736 B2 | * | 5/2003 | Forrest et al. | 427/64 |

FOREIGN PATENT DOCUMENTS

| | | |
|---|---|---|
| EP | 0 387 943 A1 | 9/1990 |
| EP | 0 714 999 A1 | 5/1996 |

* cited by examiner

Primary Examiner—Robert Kunemund
(74) Attorney, Agent, or Firm—St. Onge Steward Johnston & Reens, LLC

(57) ABSTRACT

The invention relates to a method and a device for depositing especially, organic layers. In a heated reactor, a non-gaseous starting material that is stored in a source in the form of a container is transported from said source to a substrate by a carrier gas in gaseous form and is deposited on said substrate. The rate of production of the gaseous starting material by the source is unpredictable due to a heat input that cannot be regulated in a reproducible manner and due to cooling resulting from the carrier gas. The invention therefore provides that the preheated carrier gas washes through the starting material from bottom to top, the starting material being kept essentially isothermal in relation to the carrier gas by the heated container walls.

16 Claims, 4 Drawing Sheets

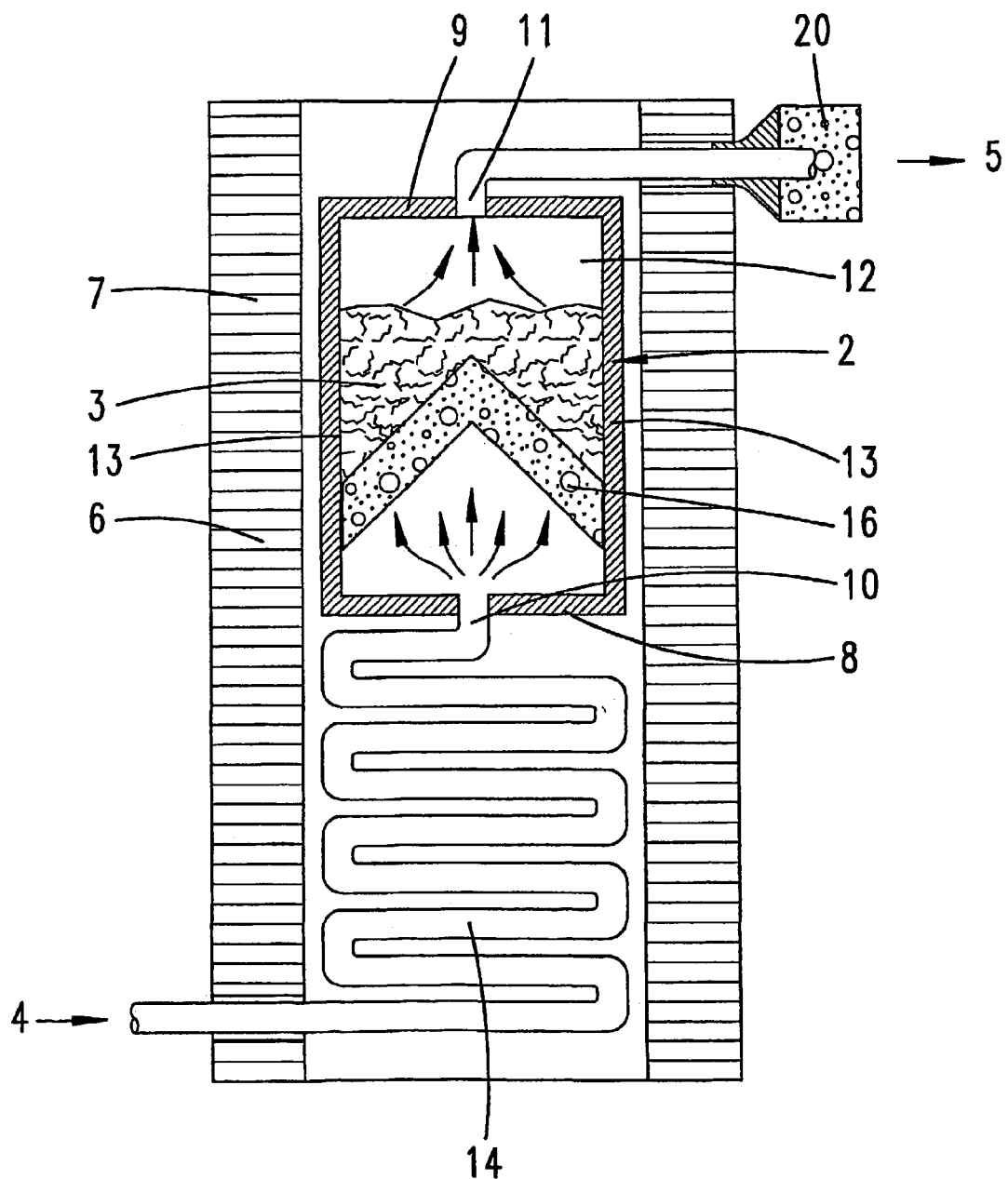

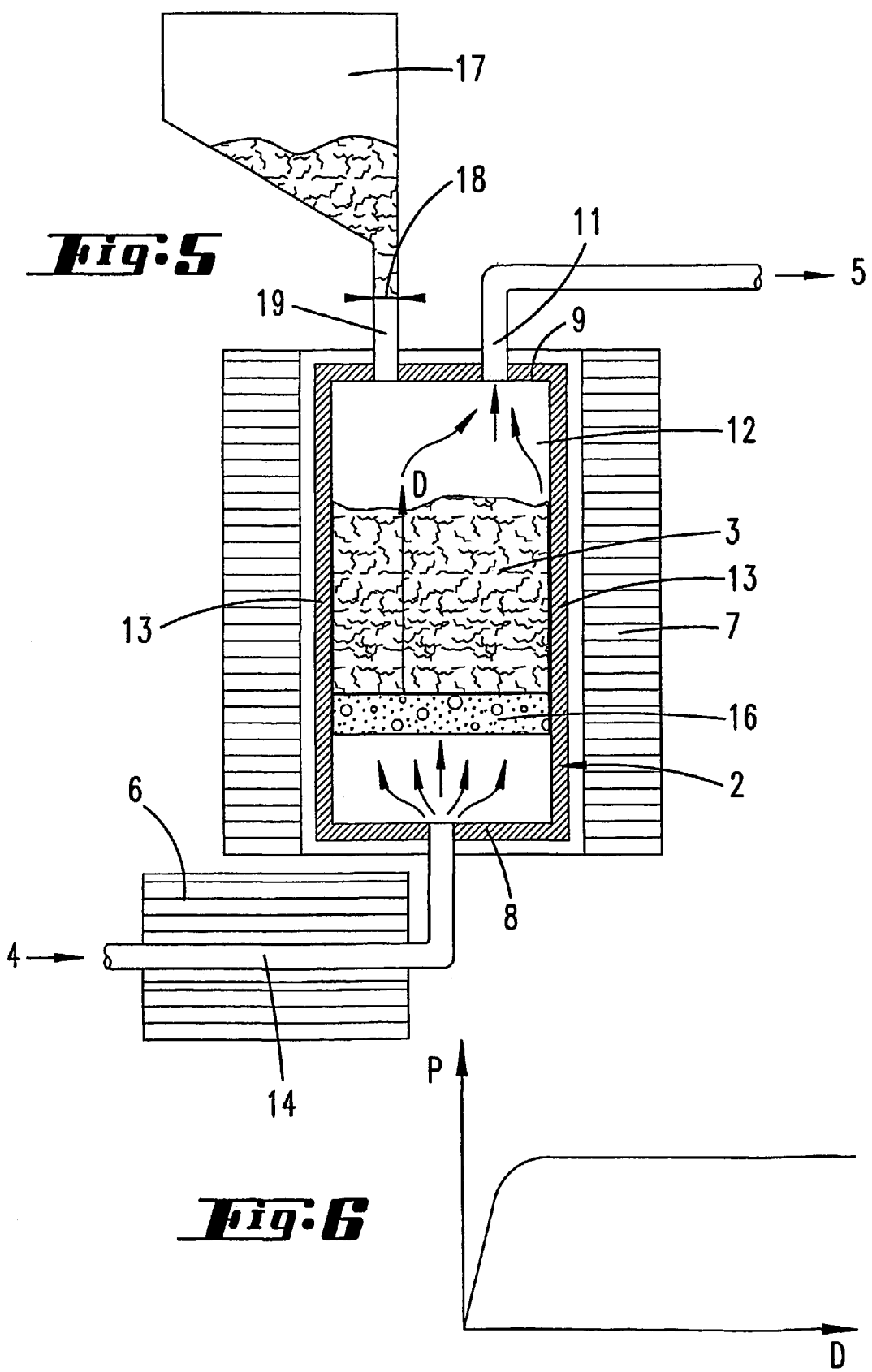

METHOD AND DEVICE FOR DEPOSITING IN PARTICULAR ORGANIC LAYERS USING ORGANIC VAPOR PHASE DEPOSITION

This application is a continuation of pending International Patent Application No. PCT/EP01/10961 filed Sep. 22, 2001, which designates the United States and claims priority of pending German Application No. 100 48 759, filed Sep. 29, 2000.

FIELD OF THE INVENTION

The invention relates to a method for depositing in particular organic layers, in which, in a heated reactor, a non-gaseous starting material, which is held in stock in a source formed by a vessel, is transported in the gaseous state from the source to a substrate by means of a carrier gas, and is then deposited on the substrate.

These methods are used to produce in particular organic light-emitting diodes (OLEDs). It is referred to as the OVPD (organic vapor phase deposition) process. The starting materials used are organic molecules which are present in particular in the form of salts and in granule form, but may also be in the liquid state. These molecules have a very low vapor pressure. As a result of the starting material being heated, it is converted into the gaseous state by sublimation. In the prior art, the vessel is a dish which is open at the top and which contains the starting material. This dish is pushed into a source zone of the heated reactor. The starting material which evaporates from the bed of granules or a melt is transported through the reactor by means of a carrier gas, for example nitrogen. The substrate may be at a substrate temperature which is lower than the source temperature. The starting material can be deposited there. In the prior art, process pressures of 0.2 mbar are used.

The invention also relates to a device for carrying out the method, having a source, which is associated with a heatable reactor, in the form of a vessel (2) for receiving a non-gaseous starting material.

The invention is based on the object of providing measures for allowing the growth rates to be predetermined more accurately and for coating relatively large substrate surfaces more efficiently than has hitherto been known from the prior art.

The invention is based on the discovery that the source, on account of a heat supply which cannot be set reproducibly and cooling by the carrier gas, has an unpredictable production rate of gaseous starting material. This entails the fluctuating growth rates which are deemed disadvantageous.

To solve the above problem, the invention described in the claims is proposed. Claim 1 is directed at the carrier gas, in the method, being preheated and being flushed through the starting material from the bottom upwards or, conversely, from the top downwards, the starting material being kept isothermally with respect to the carrier gas on account of heated vessel sidewalls. Since the carrier gas flowing into the vessel is at the same temperature as the starting material which has been heated by heat transfer from the vessel walls, cooling no longer takes place. The heat of condensation which is extracted from the starting material, which is in particular in powder or granule form, during the evaporation is returned via the side walls. To assist the supply of heat, it is also possible for heating rods to project into the starting material. The process parameters are preferably set in such a way that the carrier gas is saturated just a few millimeters after it has come into contact with the starting material. The saturation preferably occurs within the bottom third or bottom fifth of the receiving chamber. In a variant of the method, the vessel can be topped up from the top. It is preferable for the carrier gas to be preheated by the same heating means which heats the vessel. Metal, preferably aluminum is particularly suitable for use as the vessel wall.

The invention also relates to a refinement of the device of the generic type through the fact that the vessel has a gas inlet at the base and a gas outlet at the top and, between gas inlet and gas outlet, a receiving chamber which can be filled with the starting material, and a heating means for isothermal heating of the carrier gas and of the starting material is associated with the vessel walls and the carrier-gas feed line which opens out into the gas inlet. Alternatively, it is possible to provide for the vessel to have a gas outlet at the base and a gas inlet at the top, so that flow through it takes place from the top downwards. The receiving chamber may also be formed as an insert. This insert can then be exchanged. The insert is inserted into the vessel. It contains the organic material. If the material has been consumed or partially consumed, the insert can be removed and exchanged for a full insert. The vessel is surrounded in the form of a ring and, in addition to the inlet and outlet openings, preferably only has a topping-up opening. In a preferred configuration of the vessel, a gas-permeable partition, which may consist of porous material, is located above the gas inlet. The partition may be formed as a frit. The starting material, which is in particular in powder or granule form, is located on this partition in the form of a bed. The carrier gas is brought to the source temperature by an upstream heating means. This carrier gas then passes uniformly through the porous partition and flushes through the bed located on the partition. It is also possible to use liquid starting materials. Then, the carrier gas flushes through the liquid in a similar way to in a washing bottle. The partition may be planar, but may also be formed in the shape of a dome or a cone. In a preferred configuration, the carrier gas and the vessel are heated by the same heating means. Not only is this advantageous in structural terms, but also it offers a high level of certainty that the carrier gas flowing into the vessel will already be at a temperature which corresponds to the temperature of the starting material. In a refinement of the device, heating rods, which may be separately heated or are connected in a thermally conductive manner to the vessel wall in order to supply heat to the starting material, project into the starting material. It may be possible to top up the receiving chamber from above. A storage chamber may be provided above the receiving chamber. A stock of the starting material may be located in this storage chamber. This stock can be fed to the receiving chamber via a closable passage in order to top up the receiving chamber. The storage chamber does not need to be heated. It may even be disposed outside the reactor and simply connected to the reactor or the vessel by means of a top-up connection.

BRIEF DESCRIPTION OF THE DRAWINGS

Exemplary embodiments of the invention are explained below with reference to accompanying drawings, in which:

FIG. 4 shows a third exemplary embodiment of the invention, in diagrammatic illustration, FIG. 5 shows a fourth exemplary embodiment of the invention, in diagrammatic illustration, and FIG. 6 shows the curve illustrating the way in which the carrier gas is enriched with the gaseous starting material as a function of the partial pressure of the gaseous starting material in the carrier gas from the location above the partition.

DETAILED DESCRIPTION OF DRAWINGS

Figure 1:
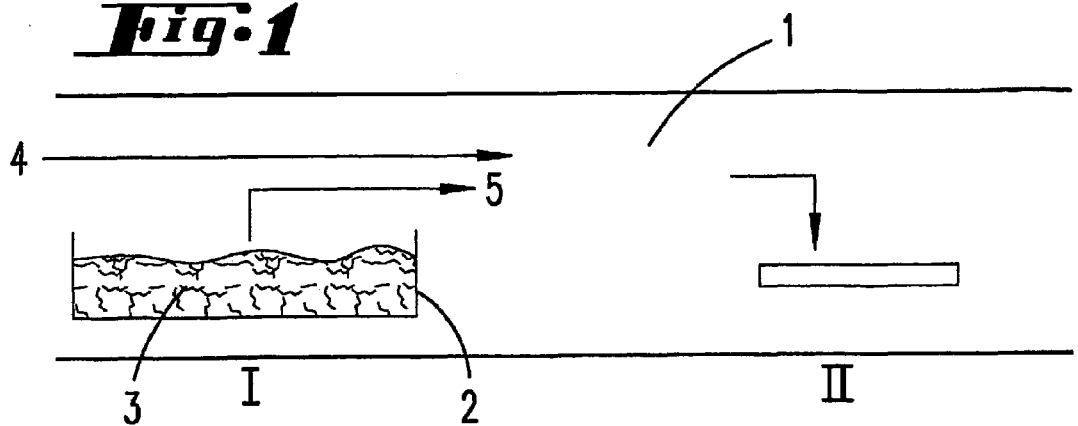
FIG. 1 shows the method or the device for carrying out the method according to the prior art, in highly diagrammatic form.
Figure 2:
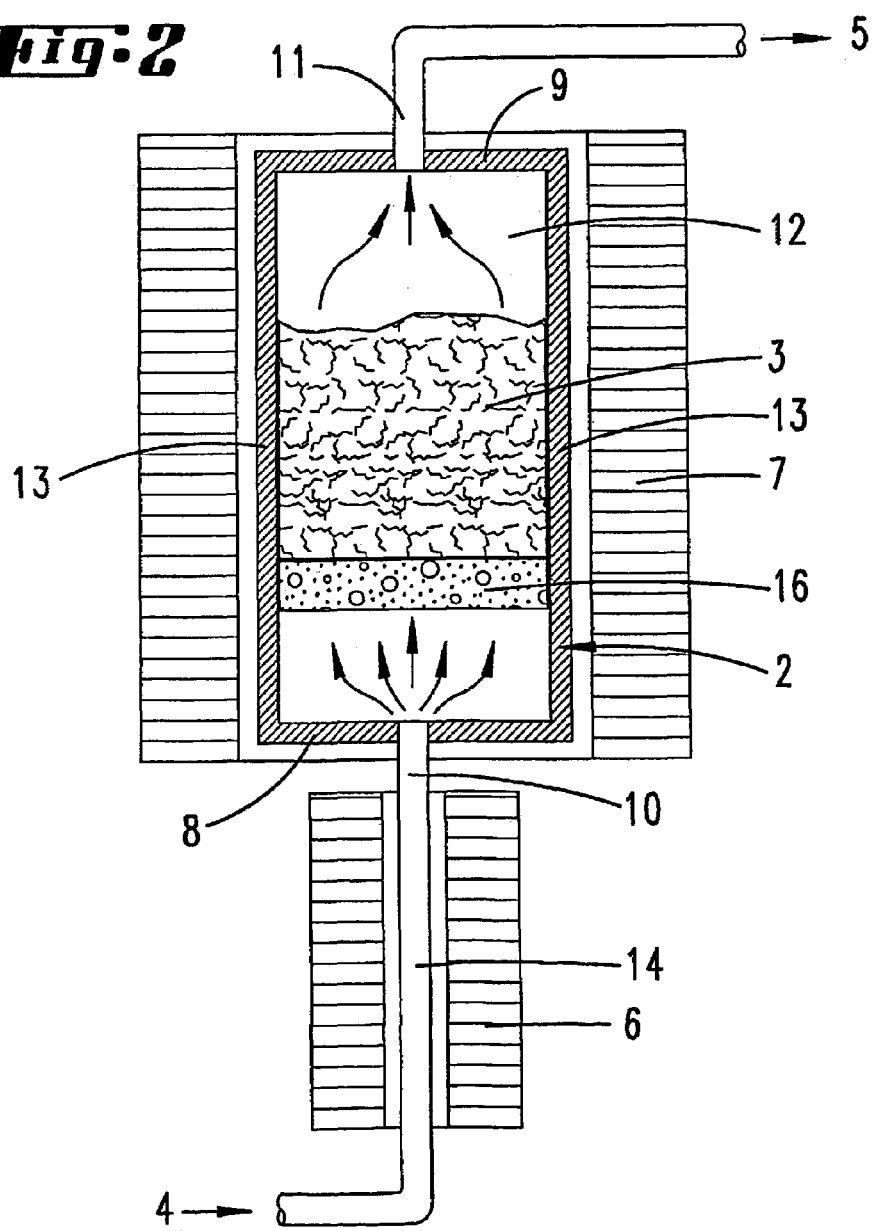
FIG. 2 shows, likewise only in diagrammatic form, a first exemplary embodiment of a source which is formed in accordance with the invention.
Figure 3:
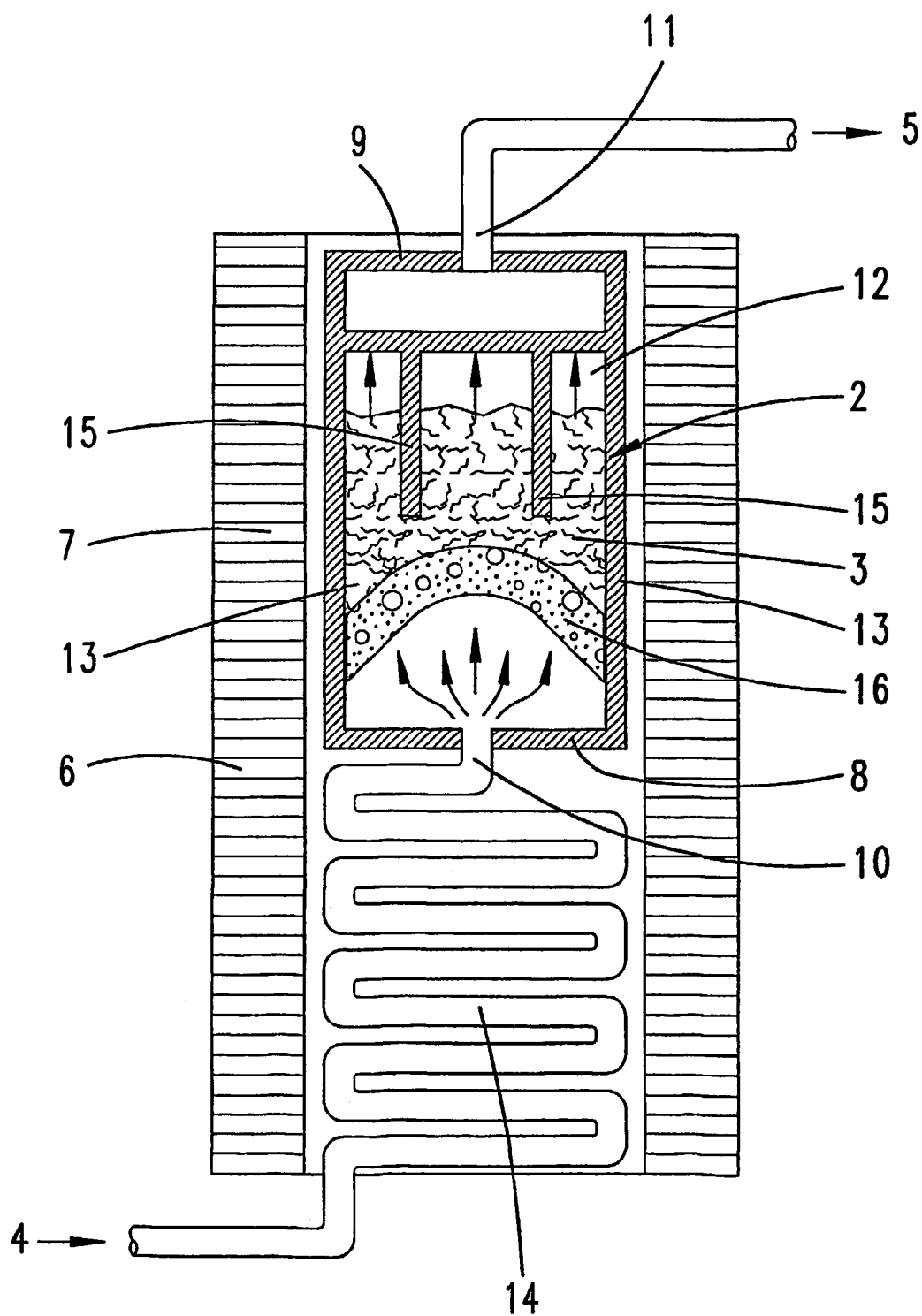
FIG. 3 shows a further exemplary embodiment of the invention, in diagrammatic illustration.

In the OVPD process, the carrier gas 4 is fed to an externally heated reactor 1. In a first hot zone, the source zone 1, a vessel 2 is placed into the reactor, this vessel containing a bed of a starting material. The starting material is sublimed at the source temperature. The gaseous starting material 5 is then transported with the carrier gas 4 to the substrate 11, where it condenses out of the gas phase in order to deposit a layer there.

The devices which are diagrammatically depicted in FIGS. 2 to 5 replace the dish-like vessel 2 of the prior art which is illustrated in FIG. 1.

According to the invention, the vessel 2 is closed. It has a base 8, in particular cylindrical sidewalls 13 and a cover 9. The base has a gas inlet 10. The cover has a gas outlet 11. In the lower region of the vessel 2, which consists of metal, in particular aluminum, there is an inflow space, into which the carrier gas 4, which flows through the carrier-gas feed line 14, can flow. At the top, this space is delimited by a porous partition 16. The gas stream passes through this partition and into the starting material 3 which forms a bed on the partition 16. The carrier gas 4 flushes through the starting material 3 from the bottom upward, the carrier gas being saturated with the gaseous starting material even just above the partition 16 and being discharged into the reactor from the gas outlet 11 together with the gaseous starting material 5. The entire device as illustrated in FIGS. 2 to 5 can be integrated in the reactor. The reactor is structurally adapted.

The feed line 14 is heated by a heating means 6. The latter heats the carrier gas 4 to the same temperature as the starting material 3 in the receiving chamber 12 disposed above the partition 16. To supply the starting material 3 with the quantity of heat which is removed from the starting material 3 during vaporization, the vessel 2 has a vessel heating means 7. In the exemplary embodiment, the vessel heating means 7 surrounds the outer vessel wall 13 in order to heat it. Heat conduction causes the heat supplied to the vessel wall to be fed to the starting material 3. In the exemplary embodiment illustrated in FIGS. 3 and 4, the heating means 6 of the carrier-gas feed line 14 is the same heating means as the vessel heating means 7. To lengthen the distance covered by the carrier gas 4 which is to be heated, the carrier-gas feed line 14 may be of coiled configuration. In the exemplary embodiment illustrated in FIG. 3, the partition 16 is configured in the shape of a dome. Moreover, in this case heating rods 15 project into the bed of the starting material 3. The heating rods 15 are thermally conductively connected to the vessel wall 13.

In the exemplary embodiment illustrated in FIG. 4, the partition 16 is conical in form. The supply line for the carrier gas or the removal thereof can be affected through openings of a heating means 6, 7 which surrounds the vessel and the feed line 14.

In the exemplary embodiment illustrated in FIG. 5, the receiving chamber 12 can be topped up from above. For this purpose, a filling passage 19 opens out into the vessel cover. This filling passage 19 can be closed off by a closure means 18. Above the closure means there is a storage chamber 17 in which there is a store of the starting material 3. The storage chamber may be located outside the reactor and may be larger than illustrated.

FIG. 6 shows that the partial pressure P of the starting material in the carrier gas has reached the saturation pressure even a short distance D above the partition 16, so that source depletion does not take place even if the filling level of the receiving chamber 12 drops.

The measures according to the invention ensure that the parameters which have an adverse effect on the source conversion, such as source temperature and free surface area of the starting material, no longer have any adverse effects on the reproducibility of the growth rate.

In the exemplary embodiment illustration in FIG. 4, a filter 20 in the form of a frit is provided in the reactor upstream of the gas outlet, in order to prevent solid particles or drops from being transported out of the vessel into the reactor.

In a variant of the invention which is not currently preferred, it is also provided that the carrier gas is introduced into the vessel at elevated temperature. The heat which is required for sublimation of the starting material can then be at least in part taken from the carrier gas, the carrier gas then being cooled to the temperature of the vessel wall, so that isothermal conditions prevail once again.

The carrier gas can be heated by the partition 16 being heated. For this purpose, the partition 16 can be made from metal.

In the exemplary embodiments which have been explained with reference to the figures, the flow through the vessel is always from the bottom upward. However, the invention also encompasses embodiments in which the gas flow runs in the opposite direction, namely from the top downward. In this case, vessels of this type have a gas inlet at the top and a gas outlet at the base.

Furthermore, the invention also relates to embodiments in which the organic material is received in inserts which can be inserted into the vessel. In this case, the organic material does not have to be tipped directly into the vessel. It can be prepared in advance in the inserts. These inserts can then be inserted into the vessel. This in particular allows a rapid change between different organic materials.

All features disclosed are (inherently) pertinent to the invention. The disclosure content of the associated/appended priority documents (copy of the prior application) is hereby incorporated in its entirety in the disclosure of the present application, partly with a view to incorporating features of these documents in claims of the present application.

What is claimed is:

1. A method for depositing layers of an organic material where a non-gaseous starting material held in stock in a source formed by a vessel is transported in a gaseous state, by means of a carrier gas, to a substrate, the substrate being located in a heated reactor and the gaseous starting material, on account of a substrate temperature which is lower than the source temperature, condenses on the substrate so as to form a layer, the walls of the vessel being heated by a heater, and the carrier gas flushing through the starting material, which is held in stock in the vessel, from the bottom upward, the temperature of the carrier gas flowing in corresponding to the temperature of the starting material.

2. Method according to claim 1, wherein the heat of evaporation is fed to the starting material via the vessel walls and/or via heating rods which project into the starting material.

3. Method according to claim 2, wherein the carrier gas is already saturated with the gaseous starting material within the bottom third, preferably bottom fifth, of the receiving chamber.

4. Method according to claim 3, wherein the vessel is topped up from the top.

5. Method according to claim 4, wherein the carrier gas is fed to the vessel at elevated temperature, so that the heat of sublimation is at least partially removed from the carrier gas.

6. A device for carrying out the method according to claim 5, wherein the vessel has an inlet and a gas outlet, and, between gas inlet and gas outlet, a receiving chamber is filled with the starting material, and a heater for substantially isothermal heating of the carrier gas and of the starting material is associated with the vessel walls and the carrier-gas feed lines which open out into the gas inlet.

7. Device according to claim 6, wherein the vessel has a gas-permeable partition, which is at a spacing from the gas inlet and on which the starting material, which is in particular in powder or granule form, is located.

8. Device according to claim 7, wherein the partition is planar or in the shape of a dome or a cone.

9. Device according to claim 8, wherein the carrier gas and the vessel are heated by the same heating means.

10. Device according to claim 9, further comprising heating rods which project into the receptacle.

11. Device according to claim 10, further comprising a storage chamber disposed above the receiving chamber and connected to the receiving chamber via a passage which is restrictable.

12. Device according to claim 11, wherein the partition is heatable and in particular comprises a metal.

13. Device according to claim 12, wherein the gas outlet has a filter, in particular in the form of a frit.

14. Device according to claim 13, wherein the gas inlet is disposed at the base, and the gas outlet is disposed at the top, or the gas inlet is associated with the cover and the gas outlet is associated with the base.

15. Device according to claim 14, further comprising an insert which is filled with the organic material, and is introduced into the vessel and has a gas-permeable insert wall through which the gas flowing through the vessel can flow.

16. A method for depositing layers of an organic material on a substrate comprising the steps of:

providing a non-gaseous starting material in a source formed by a vessel;

positioning the substrate in a heated reactor, the temperature of the substrate being lower than the temperature of the source;

providing a carrier gas having a controlled temperature corresponding to the temperature of the starting material;

flushing the controlled temperature carrier gas through the starting material from the bottom upward;

transitioning the non-gaseous starting material to a gaseous state at least in part with the controlled temperature carrier gas;

transporting the starting material in a gaseous state with the controlled temperature carrier gas to the substrate, the temperature of the starting material being higher than the temperature of the substrate; and condensing the starting material on the substrate to for a layer.

* * * * *